(12) United States Patent
Ko (10) Patent No.: US 6,427,623 B2
(45) Date of Patent: Aug. 6, 2002

(54) CHEMICAL VAPOR DEPOSITION SYSTEM

(75) Inventor: Sang-Tae Ko, Seoul (KR)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 09/886,273

(22) Filed: Jun. 22, 2001

(30) Foreign Application Priority Data

Jun. 23, 2000 (JP) ...................................... 2000-188664

(51) Int. Cl.$^7$ ............................................. C23C 16/00
(52) U.S. Cl. ................................................... 118/723 E
(58) Field of Search ....................... 118/723 E; 156/345

(56) References Cited

U.S. PATENT DOCUMENTS 6,245,396 B1    6/2001    Nogami

OTHER PUBLICATIONS

Fineprocess Technology for Flat–Panel Display Conference, Jul. 5–Jul. 7, 2000.
Kenji Ishibashi et al. Plasma Damage Free SiO$_2$ Formation for Poly– Si TFT by Radical Shower CVD, Sputtering & Plasma Processes, Sep. 26, 2000, vol. 15 No. 4.
The Japanese Society of Applied Physics, Extended Abstracts (60th Autumn Meeting, 1999), No. 2.
The Japanese Society of Applied Physics and Related Societies, Extended Abstracts (47th Spring Meeting, 2000), No. 2.
The Japanese Society of Applied Physics, Extended Abstracts (61st Autumn Meeting, 2000), No. 1.
A. Kumagai et al, High–quality SiO$_2$ film depositing using active reaction by oxygen radical, The Sixth International Symposium on Sputtering & Plasma Processes, Proceedings, pp. 233–236, Jun. 13–15, 2001, Kanazawa Institute of Technology Kanazawa, Ishikawa, Japan.
R. Byron Bird et al., Transport Phenomena, Department of Chemical Engineering, University of Wisconsin, 1960.
Ge Xu et al., Plasma Damage Free SiO$_2$ Deposition for Low Temperature Ploy–Si AMLCD, The First International Display Manufacturing Conference, Proceedings Sep. 5–7, 2000.
Akira Kumagai et al., RS–CVD SiO$_2$ Formation with Radical Source, Digest of Technical Papers International Workshop on Active–Matrix Liquid Crystal Displays, Kogakuin University, Tokyo, Japan Jul. 12–14, 2000.
H. Nogami et al. Silicon Dioxide Film Formation on Large Area Substrates using a Novel Radical Source, Process Development Laboratory, ANLEVA Corporation, IDW Proceedings 1999, pp. 167–170.
Robert C. Reid et al., The Properties of Bases and Liquids, 4th Edition, Mc Graw–Hill Books in Chemical Engineering.

*Primary Examiner*—Thi Dang
(74) *Attorney, Agent, or Firm*—Wenderoth, Lind & Ponack, L.L.P.

(57) ABSTRACT

A CVD system in which a vacuum container is separated into a plasma generating space and a film forming space by a conductive partition wall having plural penetration holes, radicals generated in the plasma generating space are introduced into the film forming space only through the penetration holes of the partition wall, and material gas supplied from outside into the partition wall is introduced into the film forming space through the internal space of the partition wall, which is communicating with the film forming space through plural diffusion holes while separated from the plasma generating space and the penetration holes, and a film is formed on the substrate by the radicals and material gas introduced into the film forming space.

In the CVD system, the penetration holes (25) of the conductive partition wall (14) are formed so that the hole diameter at the film forming space (16) side may be equal to or larger than the hole diameter at the plasma generating space (15) side.

Besides, the penetration holes (25) are formed of structures (30) independent from the conductive partition wall (14).

6 Claims, 5 Drawing Sheets

CHEMICAL VAPOR DEPOSITION SYSTEM

BACKGROUND OF THE INVENTION

1. Field of the Invention

The present invention relates to a chemical vapor deposition (referred to as CVD in this specification) system, and more particularly to a CVD system suited for forming a film on a large flat panel substrate.

2. Description of the Related Art

As a manufacturing method of liquid crystal display, a method of using high temperature polysilicon TFT (thin film transistor) and a method of using low temperature polysilicon TFT have been known. In the manufacturing method of using high temperature polysilicon TFT, in order to obtain a silicon oxide film of high quality, a quartz substrate which can be fit for a high temperature exceeding 1000° C. is used. By contrast, in manufacture of low temperature polysilicon TFT, an ordinary glass substrate for TFT is used, so that it is necessary to form a film at low temperature (for example, 400° C.). The manufacturing method of liquid crystal display by using low temperature polysilicon TFT does not require any special substrate, and is hence widely employed recently, and its production is expanding.

In manufacture of liquid crystal display by using low temperature polysilicon TFT, when forming a silicon oxide film appropriate as gate insulating film at low temperature, plasma enhanced CVD is used.

When forming a silicon oxide film by the plasma enhanced CVD, silane and tetraethoxy silane (TEOS) are used as representative material gas.

When forming a silicon oxide film by plasma enhanced CVD, using silane or the like as material gas, in a conventional plasma enhanced CVD system, the material gas and oxygen are introduced in the front space of the substrate, plasma is produced by mixed gas of material gas and oxygen, and the substrate is exposed to the plasma, so that a silicon oxide film is formed on the surface of the substrate. In such a conventional plasma enhanced CVD system, the material gas is directly supplied into the plasma produced in the plasma enhanced CVD system. Accordingly, in the conventional plasma enhanced CVD system, ions of high energy are injected from the plasma existing in the front space of the substrate to the film forming surface of the substrate, and the silicon oxide film is damaged, and film properties are impaired. Further, since the material gas is directly introduced into the plasma, the material gas and plasma react violently with each other to generate particles, thereby lowering the yield.

To solve the problems, in the previous Japanese Patent Application (unexamined Japanese Patent Publication No. JP P2000-345349A), it has been attempted to improve the conventional plasma enhanced CVD system, and a new CVD system was proposed.

The CVD system proposed in JP P2000-345349A is a system for producing plasma in a vacuum container to generate radicals, and forming a film on the substrate by the radicals and material gas. A conductive partition wall is disposed in the inside of the vacuum container. Thereby, the inside of the vacuum container is separated by the conductive partition wall into two compartments. One of these two compartments is formed as a plasma generating space containing high frequency electrode, and the other is formed as a film forming space with a substrate holding mechanism for mounting substrate. The conductive partition wall has plural penetration holes for communicating between the plasma generating space and film forming space, and also has an inner space separated from the plasma generating space and communicating with the film forming space through plural diffusion holes. The material gas is supplied from outside into the inner space of the conductive partition wall, and is introduced into the film forming space through the plural diffusion holes. On the other hand, radicals formed in the plasma generating space are introduced into the film forming space through the plural penetration holes opened in the conductive partition wall. Herein, the size (length and diameter) and structure of the penetration holes and diffusion holes are determined so that the material gas introduced in the film forming space may not diffuse reversely into the plasma generating space as for the penetration holes, and so that the radicals introduced in the film forming space may not diffuse reversely into the inner space of the conductive partition wall as for the diffusion holes.

By the CVD system proposed in JP P2000-345349A, worsening of film properties of silicon oxide film formed on the glass substrate can be prevented, and the product yield can be improved.

Figure 5:
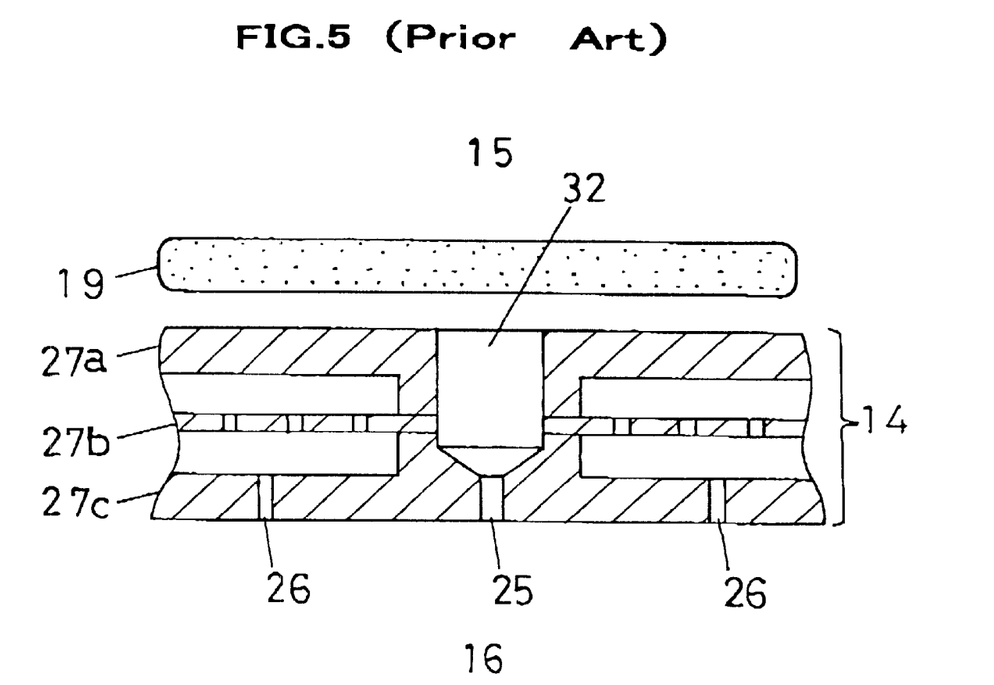
FIG. 5 is a schematic enlarged view of internal structure of the partition wall in the prior CVD system.

However, by the CVD system proposed in JP P2000-345349A, when a silicon oxide film is formed on a glass substrate of a wide area, for example, 370 mm×470 mm, it was often insufficient in the aspect of uniformity, in both film thickness and quality of silicon oxide film. That is, in a conductive partition wall 14 of the CVD system proposed in JP P2000-345349A shown in an enlarged view in FIG. 5, a local abnormal discharge (hollow cathode discharge) is induced in an inner space 32 of the opening at the side of a plasma generating space 15 of penetration holes 25 communicating between the plasma generating space 15 side and film forming space 16 side divided by the conductive partition wall 14, which has been considered to lead to unstable plasma.

The penetration holes of the conductive partition wall which determine the uniformity of film quality and thickness of the silicon oxide film formed on the wide substrate are most important parts demanding the highest precision in manufacture because they have essential functions for preventing gas leak from the inner space of the conductive partition wall filled with material gas, preventing abnormal discharge in the penetration holes, and realizing smooth transfer of neutral radicals Therefore, the CVD system proposed in JP P2000-345349A had a room for further studies in the aspects of performance such as improvement of uniformity of thickness and quality of the film formed on the substrate, optimum structure for penetration holes, and means for manufacture.

SUMMARY OF THE INVENTION

It is hence an object of the present invention to present a CVD system capable of forming a film of uniform thickness and uniform quality over a wide area, by enhancing the plasma stability, operating stably and continuously, achieving a high product yield, by further improving the CVD system proposed in JP P2000-345349A capable of preventing inverse diffusion of material gas into the plasma forming region, in the case of forming a silicon oxide film on a wide substrate by using material gas such as silane, on the basis of the CVD using radicals generated by plasma, in manufacture of large liquid crystal display using low temperature polysilicon TFT.

It is also an object to present a CVD system capable of stably maintaining many functions of the conductive partition wall, especially the penetration holes, including prevention of gas leak from the conductive partition wall filled with material gas, prevention of abnormal discharge in the penetration holes communicating from the plasma generating space to the film forming space, and efficient transfer of neutral radicals from the plasma generating space side to the film forming side.

To achieve these objects, the CVD system of the present invention is characterized by the following structure.

That is, the CVD system of the present invention is a CVD system for producing plasma in a vacuum container to generate radicals, and forming a film on the substrate by the radicals And material gas. A conductive partition wall is disposed in the inside of the vacuum container. Thereby the inside of the vacuum container is separated by the conductive partition wall into two compartments. One of these two compartments is formed as a plasma generating space containing high frequency electrode, and the other is formed as a film forming space with a substrate holding mechanism for mounting substrate. The conductive partition wall has plural penetration holes for communicating between the plasma generating space and film forming space, and also has an inner space separated from the plasma generating space and communicating with the film forming space through plural diffusion holes. The material gas is supplied from outside into the inner space of the conductive partition wall, and is introduced into the film forming space through the plural diffusion holes. A high frequency electric power is applied to the high frequency electrode to generate plasma discharge in the plasma generating space. And radicals formed in the plasma generating space are introduced into the film forming space through the plural penetration holes opened in the conductive partition wall.

In this CVD system, plasma is generated by using oxygen gas, and a thin film is deposited on the surface of a substrate by using material gas such as silane. And the inner space of the vacuum container used as the treating compartment is separated by a conductive partition wall into a plasma generating space and a film forming space. So that the processing surface of the substrate disposed in the film forming space is not exposed to the plasma. Besides, being separated by the conductive partition wall, the material gas introduced in the film forming space is sufficiently prevented from moving to the plasma generating space side. That is, the conductive partition wall has plural penetration holes, and the plasma generating space and film forming space at both sides of the conductive partition wall communicate with each other only through the penetration holes, and the size and structure of the penetration holes are determined so that the material gas introduced in the film forming space may not diffuse reversely into the plasma generating space side.

The size and structure of the penetration holes are same as proposed in the previous Japanese Patent Application (JP P2000-345349A), that is, the condition of uL/D>1 is satisfied, where u is the gas flow velocity in penetration holes, L is the substantial length of penetration holes (see FIG. 3, FIG. 4, in these cases, L is the length of the portion of the minimum diameter), and D is the binary diffusivity (mutual gas diffusion coefficient of two types of gases of material gas and process gas, in this case; oxygen gas). In the diffusion holes, too, when the same condition as in the penetration holes is applied, it is effective to prevent the radicals introduced in the film forming space from diffusing reversely into the inner space of the conductive partition wall, and the penetration holes and diffusion holes of the partition wall in the CVD system of the present invention are formed to satisfy this condition.

It is a feature of the CVD system of the present invention that the diameter of penetration hole at the film forming space side are designed to be equal to or larger than the diameter of penetration hole at the plasma generating space side.

The shape of penetration holes that has an equal or larger diameter at the film forming space side as compared with diameter at the plasma generating space side is realized by, for example, a cylindrical shape from the plasma generating space side toward the film forming space side, or a shape consisting of a cylindrical portion from the plasma generating space side toward the film forming space side and a conical portion widening in diameter consecutive to the cylindrical portion, or a shape consisting of a cylindrical portion from the plasma generating side toward the film forming side and a conical portion widening in diameter consecutive to the cylindrical portion and a cylindrical portion of widen diameter consecutive to the conical portion.

By forming the penetration holes in such characteristic shape, the portion satisfying the hollow cathode discharge condition can be eliminated. As a result, the stability of plasma is enhanced, and abnormal discharge is prevented at the plasma generating space side of penetration holes communicating from the plasma generating space side to the film forming space side, and as a result neutral radicals can be transferred efficiently from the plasma generating space side to the film forming side. Thus, stable operation is realized continuously, which results in a high production throughput, while maintaining the capability of forming a uniform film in thickness and quality over a wide area can be presented.

For example, by the CVD system of the present invention, a film thickness distribution of ±5,2%, which is better than in prior plasma enhanced CVD where ±10%–15% uniformity is typically obtained, could be obtained on a glass substrate of 370 mm×470 mm (thickness of silicon oxide film: 200 nm).

In the CVD system of the present invention as the before described, the penetration holes can be formed by a structure independent from the conductive partition wall. Thus, the penetration holes can be processed precisely and at a low cost.

DESCRIPTION OF THE PREFERRED EMBODIMENTS

Preferred embodiments of the present invention are described below while referring to the accompanying drawings.

Figure 1:
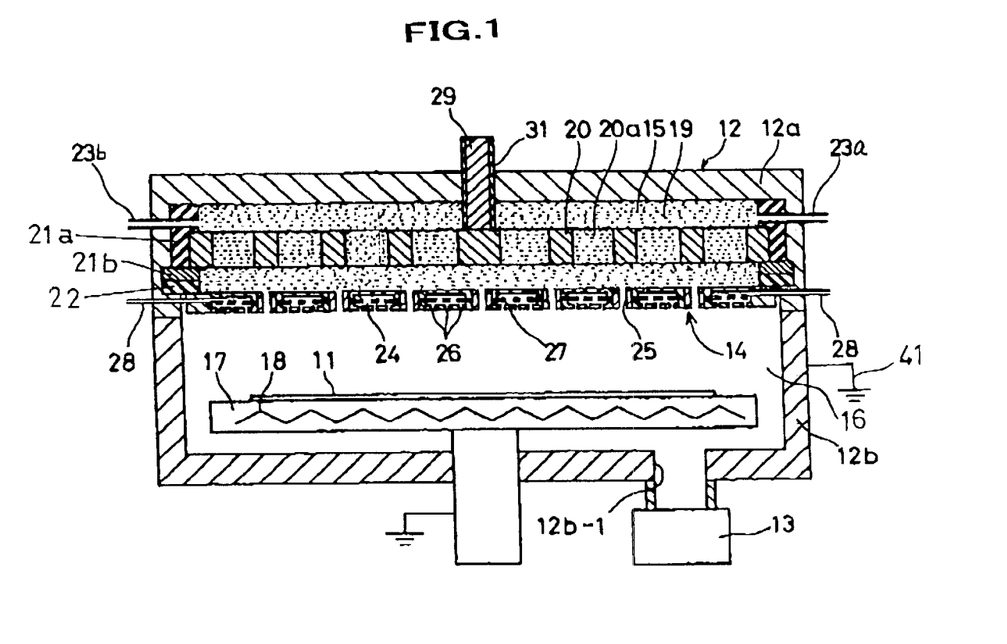
FIG. 1 is a front sectional view showing a first preferred embodiment of a CVD system of the present invention.
Figure 2:
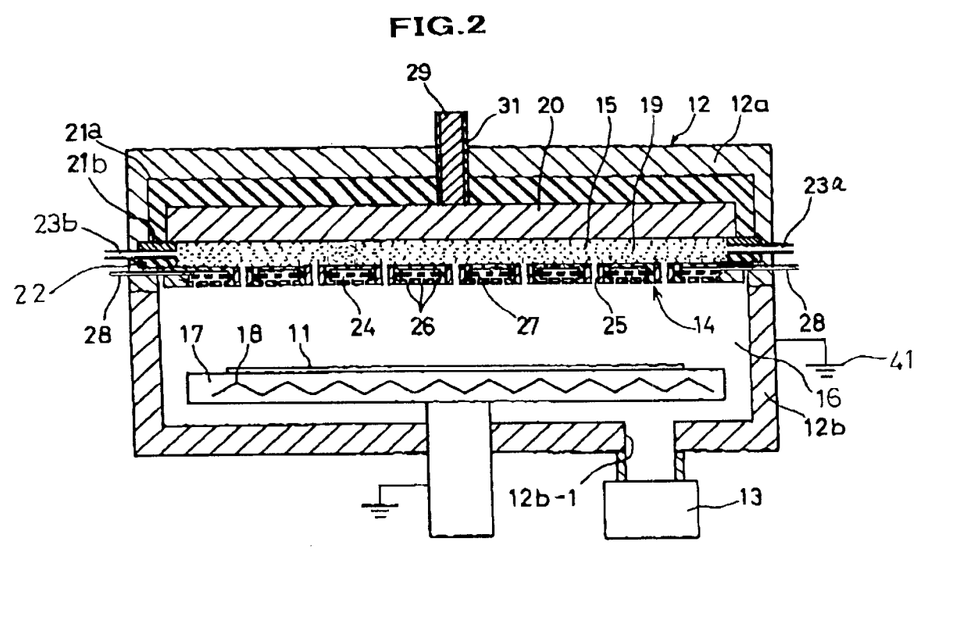
FIG. 2 is a front sectional view showing a second preferred embodiment of a CVD system of the present invention.

Referring to FIG. 1 and FIG. 2, an embodiment of a CVD system of the present invention is explained. In FIG. 1 and FIG. 2, in this CVD system, preferably, silane is used as material gas, and a silicon oxide film is formed on the top of an ordinary glass substrate 11 for TFT as a gate insulating film. A container 12 of the CVD system is a vacuum container for keeping the inside in a desired vacuum state by an exhausting mechanism 13 in a film forming process. The exhausting mechanism 13 is connected to an exhaust port 12b-1 formed in the vacuum container 12.

Inside of the vacuum container 12, a partition wall 14 formed of a conductive materials is disposed in a horizontal state, and the partition wall 14 of, for example, a rectangular plane shape is arranged so as to form an enclosed state as its peripheral edge is pressed to the lower side of a conductive fixing portion 22.

Thus, the vacuum container 12 is separated into two upper and lower compartments by the partition wall 14, and the upper compartment forms a plasma generating space 15, and the lower compartment forms a film forming space 16. The partition wall 14 has a specified thickness, and has a form of a flat plate on the whole, having a plane shape similar to the horizontal sectional shape of the vacuum container 12. An inner space 24 is formed in the partition wall 14.

The glass substrate 11 is disposed on a substrate holding mechanism 17 disposed in the film forming space 16. The glass substrate 11 is substantially parallel to the partition wall 14, and is disposed so that its film forming surface (upper side) may be in face with the lower side of the partition wall 14.

The potential of the substrate holding mechanism 17 is held at a grounding potential 41, same as the potential of the vacuum container 12. A heater 18 is provided in the substrate holding mechanism 17. By this heater 18, the temperature of the glass substrate 11 is held at a specified temperature.

The structure of the vacuum container 12 will be explained. The vacuum container 12 is, for the ease of its assembling, composed of an upper container 12a for forming the plasma generating space 15, and a lower container 12b for forming the film forming space 16. The upper container 12a and lower container 12b are assembled to compose the vacuum container 12, and the partition wall 14 is provided between them at this time. The partition wall 14 is disposed s) that its peripheral edge may contact with an electrically conductive member 22 which has the same potential as the vacuum container 12. As a result, the plasma generating space 15 and film forming space 16 separated between the upper side and lower side of the partition wall 14 are formed. By the partition wall 14 and upper container 12a, the plasma generating space 15 is formed.

In the first embodiment of the CVD system according to the present invention shown in FIG. 1, the region of generating plasma 19 in the plasma generating space 15 is composed of the partition wall 14, upper container 12a, and a flat electrode (high frequency electrode) 20 disposed nearly in the middle position between them. Plural holes 20a are formed in the electrode 20. The electrode 20 is supported and fixed by two insulating members 21a, 21b provided along the inner side of the upper container 12a. In the ceiling of the upper container 12a, a power lead-in bar 29 connected to the electrode 20 is provided. By the power lead-in bar 29, high frequency power for discharge is supplied into the electrode 20. The electrode 20 functions as high frequency electrode. The power lead-in bar 29 is covered with an insulator 31, and is insulated from other metallic parts.

The partition wall 14 is at the grounding potential 41 through an electrically conductive fixing portion 22.

A oxygen gas lead-in pipe 23a for feeding oxygen gas from outside into the plasma generating space 15, and a cleaning gas lead-in pipe 23b for feeding cleaning gas such as fluoride gas are provided through the insulating member 21a.

The inside of vacuum container 12 is separated into the plasma generating space 15 and film forming space 16 by means of the partition wall 14, and the partition wall 14 has plural penetration holes 25 formed at uniform intervals in a state of penetrating through the inner space 24. The size (length and diameter, etc.) and structure of penetration holes 25 are formed for preventing the material gas introduced in the film forming space 16 from diffusing reversely to the plasma generating space 15 side. And the plasma generating space 15 and film forming space 16 are communicated with each other only through these penetration holes 25.

In the below, the mechanism that the material gas does not diffuse reversely to the plasma generation space is explained.

When a film forming method is conducted using the CVD system of the present invention, the glass substrate 11 is transferred into the vacuum container 12 by means of a transfer robot (not shown in the drawings) and is disposed on the substrate holding mechanism 17. The inside of the vacuum container 12 is evacuated by means of the exhaust mechanism 13 and the pressure is reduced and maintained at a predetermined vacuum state. Next oxygen gas is fed through the oxygen gas lead-in pipe 23a into the plasma generating space 15 of the vacuum container 12.

The mass flow rate of the oxygen gas at this time is controlled by means of an external mass flow controller (not shown in the drawings).

On the other hand, material gas, for example, silane is led into an inner space 24 of the partition wall 14 through a material gas lead-in pipe 28, and led into the film forming space 16 through diffusion holes 26.

The flow velocity (u) of the oxygen can be obtained using the below described expressions (1) and (2), based on oxygen mass flow rate ($Qo_2$), pressure ($Po_2$), and temperature (T) of partition wall section;

$$Qo_2 = \rho o_2 u A \quad (1)$$

$$Po_2 = \rho o_2 RT/M \quad (2)$$

Where
  $\rho o_2$: Density of oxygen gas
  M: Molecular weight of oxygen
  R: Universal gas constant
  T: Absolute temperature of the partition wall section
  A: Total cross sectional area of the smallest diameter portion of the penetration holes 25 formed in the partition wall 14
  u: Flow velocity of the oxygen gas flowing through the penetration holes 25

The relation $uL/D>1$ is derived as follows. For example, regarding the relation between the oxygen and the silane that are transferring through the penetration holes 25, an expression (3) shown below is established by using the silane gas density ($\rho_{SiH_4}$), diffusion flow velocity ($u_{SiH_4}$), and the binary diffusivity ($D_{SiH_4-o_2}$). When the characteristic length of the penetration holes (the length of the portion of the minimum diameter) is represented by L, the expression (3) can be approximated by expression (4). As a result of a comparison between both sides of the expression (4), the diffusion flow velocity ($u_{SiH_4}$) of the silane is expressed by $-D_{SiH_4-o_2}/L$. Therefore, the oxygen flow velocity, as obtained from the above expressions(1) and (2), is represented by u, and the diffusion flow velocity of the silane is represented by $-D_{SiH_4-O_2}/L$. The ratio between the absolute values of these two flow velocity values is the value of $|-u/(D_{SiH_4-O_2}/L)| = uL/D_{SiH_4-O_2}$, which represents the ratio between the flow velocity of oxygen and the diffusion velocity of silane. Setting the value of $uL/D_{SiH_4-O_2}$ to exceed 1 means that the flow velocity of oxygen due to convection is greater than the diffusion velocity of silane. That is, the arrangement of the value of $uL/D_{SiH_4-O_2}$ to exceed 1 means that the diffusion influence of silane is less, and the silane should not pass through the penetration holes 25.

$$\rho_{SiH_4} U_{SiH_4} = -D_{SiH_4-O_2} \text{grad} \rho_{SiH_4} \quad (3)$$

$$\rho_{SiH_4} U_{SiH_4} \approx -D_{SiH_4-O_2} \rho_{SiH_4}/L \quad (4)$$

Next, a particular example is described below. The above expressions will produce a value of $uL/D_{SiH_4-O_2}$ as equal to about 11 in the following case; the temperature in the partition wall 14 is 300° C., the smallest diameter of the penetration holes 25 formed in the partition wall 14 is 0.5 mm, the length (L) of a portion of the diameter 0.5 mm is 3 mm, the total number of penetration holes 25 is 500, the flow rate of oxygen gas is 500 sccm (=500 cm³/minute at the normal state), and the pressure in the film forming space 16 is 100 Pa. This indicates that, compared to the diffusion of the silane gas, since the flow influence is very large, the diffusion of the silane gas into the plasma generation space 15 is reduced.

Figure 3:
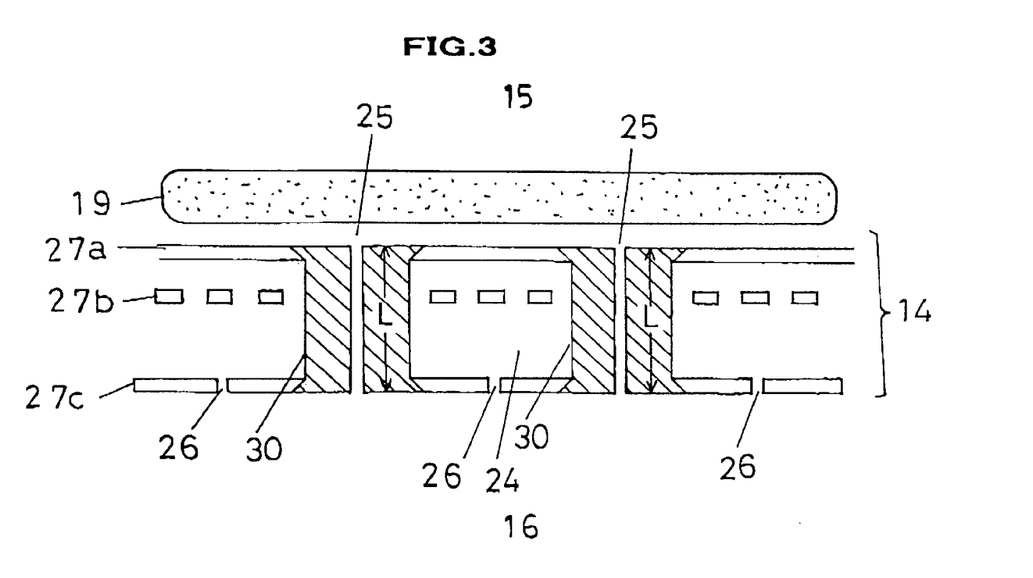
FIG. 3 is a schematic enlarged view of internal structure of a partition wall of the CVD system of the present invention.
Figure 4:
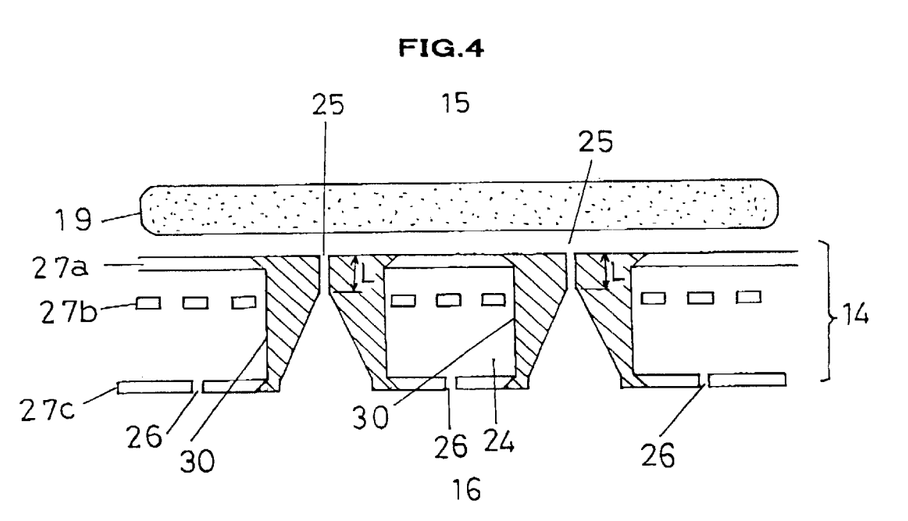
FIG. 4 is a schematic enlarged view of an internal structure of another embodiment of the partition wall of the CVD system of the present invention.

FIG. 3 is a schematic enlarged view of an internal structure of the partition wall 14, and FIG. 4 is a schematic enlarged view of an internal structure of another embodiment of the partition wall 14.

The penetration hole 25 is formed of one independent structure 30, Accordingly, the penetration bole 25 can be processed finely in a separate process of the partition wall 14 when manufacturing the partition wall 14, and the independent structures 30 having thus finely processed penetration holes 25 are assembled into the main body of the partition wall 14 in the final process, and crimped and fixed as shown in FIG. 3 and FIG. 4.

The structure 30 is mainly composed of aluminum, and is formed in box or cylinder, but the shape is not limited to them. The structure 30 may be formed of any material, as far as it has a coefficient of thermal expansion almost equal to that of the member for composing the partition wall 14 so that gap may not be formed between the partition wall 14 and structure 30 even if the temperature of the partition wall 14 rises due to heat from the substrate, and it has no problem in processability and does not have large loss probability of the radicals on its surface of the penetration holes.

The inner space 24 formed in the partition wall 14 is a space for diffusing the material gas introduced from outside into the partition wall 14 and supplying uniformly into the film forming space 16. Plural diffusion holes 26 for supplying the material gas into the film forming space 16 are formed in a lower plate 27c of the partition wall 14.

In the inner space 24, a material gas lead-in pipe 28 for feeding material gas from outside is connected to the upper side of the partition wall 14 (see FIG. 1, FIG. 2). The material gas lead-in pipe 28 is connected from the side.

Further, in the inner space 24, a pierced uniform plate 27b having plural holes for supplying the material gas uniformly from the diffusion holes 26 is disposed almost horizontally. The inner space 24 of the partition wall 14 is divided into upper and lower spaces by the uniform plate 27b.

Therefore, the material gas introduced into the inner space 24 of the partition wall 14 through the material lead-in pipe 28 is fed into the upper space, and reaches the lower space through the holes in the uniform plate 27b, and is diffused into the film forming space 16 through the diffusion holes 26.

In this structure, the material gas can be supplied uniformly into the entire film forming space 16, but the internal structure of the partition wan 14 is not particularly limited to the above structure as far as the material gas can be supplied uniformly in the entire film forming space 16.

The penetration hole 25 can have the following shapes. The one is a cylindrical shape from the plasma generating space 15 side toward the film forming space 16 side. And the others are a shape consisting of a cylindrical portion from the plasma generating space 15 side toward the film forming space 16 side and a conical portion widening in diameter consecutive to the cylindrical portion, and a shape consisting a cylindrical portion from the plasma generation space side toward the film formation side and a conical portion widening in diameter consecutive to the cylindrical portion and a cylindrical portion of widen diameter consecutive to the conical portion FIG. 3 shows the penetration hole 25 in a cylindrical shape from the plasma generating space 15 side toward the film forming space 16 side. In this case, the diameter of the opening of the penetration hole 25 facing the plasma generating space 15 is defined to such an extent that the opening of the penetration hole 25 may not expand to induce hollow cathode discharge, and the size and shape of the penetration hole 25 should satisfy the before described condition proposed in the previous Japanese Patent Application (JP P2000-345349A).

FIG. 4 shows the penetration hole 25 in a shape consisting of a cylindrical portion from the plasma generating space 15 side toward the film forming space 16 side and a conical portion widening in diameter consecutive to the cylindrical portion and a cylindrical portion of widen diameter consecutive to the conical portion. In the case of FIG. 4, too, owing to the same reason as mentioned above, the diameter of the opening of the penetration hole 25 facing the plasma generating space 15 and the size and shape of the penetration hole 25 should satisfy the same condition as in FIG. 3.

In this case, the diameter of the conical portion is not particularly limited, because it is open in the film forming space 16 and hence hollow cathode discharge is not induced.

In short, it is a feature of the present invention that the penetration holes 25 are formed to have the specific shape that the diameter, at the opening facing the film forming space 16, is equal to the diameter at the plasma generating space 15 side or larger than that at the plasma generating space 15 side, and to have the specific size which can satisfy the condition of uL/D>1 proposed by JP2000-345349A as the before described. Thereby, the abnormal discharge is not induced at the openings of penetration holes 25 facing the plasma generating space 15, and the reverse diffusion of material gas from the film forming space 16 to the plasma generating space 15 through penetration holes 25 is not occurred.

FIG. 2 shows a second embodiment of the CVD system of the present invention. A characteristic feature of the embodiment shown in FIG. 2 is that the insulating member 21a l is disposed at the inner side of the ceiling of the upper container 12a, and that the electrode 20 is disposed at its lower side. In the electrode 20, such hole 20a as in the first embodiment in FIG. 1 is not formed, but a single plate is formed. By the electrode 20 and partition wall 14, a plasma generating space 15 is formed by a parallel plate type electrode structure. The other configuration is substantially same as in the first embodiment in FIG. 1. In FIG. 2, substantially same elements as explained in FIG. 1 are identified with same reference numerals, and duplicate explanation is omitted. Further, the action and effect of the CVD system in the second embodiment are same as in the first embodiment.

In the before described CVD system of the present invention, the film forming method is explained. By a conveying robot not shown, a glass substrate 11 is carried into a vacuum container 12, and is put on a substrate holding mechanism 17. The inside of the vacuum container 12 is evacuated by an exhausting mechanism 13, and is reduced and held in a specific vacuum state. Through an oxygen gas lead-in pipe 23a, oxygen gas is guided into the plasma generating space 15 of the vacuum container 12.

On the other hand, material gas, for example, silane is led into an inner space 24 of the partition wall 14 through a material gas lead-in pipe 28. The silane is first introduced into the upper side of the inner space 24, mixed uniformly through a uniform plate 27b, moved to the lower side, and led into the film forming space 16 through diffusion holes 26 directly without contacting with the plasma. The substrate holding mechanism 17 provided in the film forming space 16 is heated by a heater 18 to be held at a specified temperature preliminarily.

In this state, a high frequency power is supplied to the electrode 20 through a power lead-in bar 29. Discharge is caused by this high frequency power, and an oxygen plasma 19 is formed around the electrode 20 in the plasma generating space 15. As the oxygen plasma 19 is generated, radicals, (in strict sense, neutral radicals ) are generated, and they are introduced into the film forming space 16 through the penetration holes 25, while the material gas is introduced into the film forming space 16 through the inner space 24 and diffusion holes 26 of the partition wall 14. As a result, the radicals and the material gas come into contact with each other for the first time in the film forming space 16, and chemical reaction is induced, and a silicon oxide is deposited on the surface of the glass substrate 11, thereby forming a thin film.

The CVD system according to the invention is also applicable to nitride film, fluoride film, and carbide film, by changing the material gas and others.

Preferred embodiments of the invention are explained as the before described by referring to the accompanying drawings, but the invention is not limited to these embodiments alone. And it can be changed and modified in various forms within the technical scope as understood from the claims given below.

What is claimed is:

1. A CVD system for producing plasma in a vacuum container to generate radicals, and forming a film on a substrate by the radicals and material gas, wherein a conductive partition wall is disposed in the vacuum container to separate it into two compartments, one of them is formed as a plasma generating space containing high frequency electrode, and the other is formed as a film forming space with a substrate holding mechanism for mounting substrates, said conductive partition wall has plural penetration holes for communicating between said plasma generating space and film forming space, and also has an inner space separated from the plasma generating space and communicating with the film forming space through plural diffusion holes, the material gas is supplied from outside into the inner space of the conductive partition wall, and is introduced into the film forming space through the plural diffusion holes, and a high frequency electric power is applied to said high frequency electrode to generate plasma discharge in the plasma generating space, and radicals formed in the plasma generating space are introduced into the film forming space through the plural penetration holes opened in the conductive partition wall, characterized that said penetration holes are formed to be same or larger in diameter at the film forming space side as compared with that at the plasma generating space side.

2. The CVD system according to claim 1, wherein the shape of the penetration holes is a cylindrical shape from the plasma generating space side toward the film forming space side, a shape consisting of a cylindrical portion from the plasma generating space side toward the film forming space side and a conical portion widening in diameter consecutive to the cylindrical portion, or a shape consisting of a cylindrical portion from the plasma generation space toward the film forming side and a conical portion widening in diameter consecutive to the cylindrical portion and a cylindrical portion of widen diameter consecutive to the conical portion.

3. The CVD system according to claim 2, wherein the penetration holes are formed to satisfy the condition of uL/D>1, where u is the gas flow velocity in the penetration hole, L is the substantial length of the penetration holes, and D is the binary diffusivity.

4. The CVD system according to claim 1, wherein the penetration holes are formed of structures independent from the conductive partition wall.

5. The CVD system according to claim 2, wherein the penetration holes are formed of structures independent from the conductive partition wall.

6. The CVD system according to claim 3, wherein the penetration holes are formed of structures independent from the conductive partition wall.

* * * * *